(12) United States Patent
Boehm et al.

(10) Patent No.: US 6,483,450 B2
(45) Date of Patent: Nov. 19, 2002

(54) METHOD AND DEVICE FOR DIGITAL-TO-ANALOG CONVERSION OF A SIGNAL

(75) Inventors: Konrad Boehm, Blaustein (DE); Johann-Friedrich Luy, Ulm (DE); Thomas Mueller, Ulm (DE)

(73) Assignee: DaimlerChrysler AG, Stuttgart (DE)

( * ) Notice: Subject to any disclaimer, the term of this patent is extended or adjusted under 35 U.S.C. 154(b) by 0 days.

(21) Appl. No.: 09/880,215

(22) Filed: Jun. 13, 2001

(65) Prior Publication Data

US 2002/0050937 A1 May 2, 2002

(30) Foreign Application Priority Data

Jun. 14, 2000 (DE) .......................... 100 28 593

(51) Int. Cl.[7] .............................. H03M 1/66
(52) U.S. Cl. ................... 341/144; 341/138; 341/152
(58) Field of Search ......................... 341/138, 144, 341/152

(56) References Cited

U.S. PATENT DOCUMENTS

| | | | | |
|---|---|---|---|---|
| 3,605,019 A | * | 9/1971 | Cutter | 370/210 |
| 3,701,143 A | * | 10/1972 | Nacht | 340/347 |
| 4,456,982 A | * | 6/1984 | Tournois | 367/11 |
| 4,573,188 A | * | 2/1986 | Lewinter | 381/46 |
| 4,973,977 A | * | 11/1990 | Hawkins et al. | 341/144 |
| 5,323,391 A | * | 6/1994 | Harrison | 370/70 |
| 5,568,142 A | * | 10/1996 | Velazquez et al. | 341/126 |
| 5,712,869 A | * | 1/1998 | Lee et al. | 370/209 |
| 5,940,434 A | * | 8/1999 | Lee et al. | 370/335 |
| 5,956,686 A | * | 9/1999 | Takashima et al. | 704/500 |
| 6,016,356 A | * | 1/2000 | Ito et al. | 382/132 |
| 6,201,490 B1 | * | 3/2001 | Kawano et al. | 341/139 |
| 6,249,749 B1 | * | 6/2001 | Tran et al. | 702/66 |
| 6,268,818 B1 | * | 7/2001 | Xin et al. | 341/143 |
| 6,324,268 B1 | * | 11/2001 | Balachandran et al. | 379/93.08 |

FOREIGN PATENT DOCUMENTS

DE 3820143 12/1989

* cited by examiner

*Primary Examiner*—Michael Tokar
*Assistant Examiner*—Nguyen Khai
(74) *Attorney, Agent, or Firm*—Davidson, Davidson & Kappel, LLC

(57) ABSTRACT

A method for digital-to-analog conversion of a digital signal ($x^d(t_i)$) comprises resolving the signal ($x^d(t_i)$) in the time region into intervals and successively transforming these intervals on the basis of orthogonal functions ($g_j^d(t)$). Coefficients ($a_j^d$) associated with the orthogonal functions ($g_j^d(t)$) are determined and converted from digital to analog and the signal ($x_a(t)$) is transformed back in the analog region on the basis of analog coefficients ($a_j$), which result therefrom, by means of orthogonal functions ($h_j(t)$).

11 Claims, 4 Drawing Sheets

$N = \dfrac{T}{\tau} = 4$ $\theta_i = \dfrac{t_i}{T}$ wal $(1,\theta_i) = -1,1,1,-1$ wal $(2,\theta_i) = 1,1,-1,-1$ wal $(3,\theta_i) = -1,+1,-1,1$ wal $(4,\theta_i) = 1,-1,1,-1$

METHOD AND DEVICE FOR DIGITAL-TO-ANALOG CONVERSION OF A SIGNAL

BACKGROUND OF THE INVENTION

The invention relates to a method and a device for digital-to-analog conversion of a signal.

Apart from fast analog-to-digital converters, there is also a need for fast digital-to-analog converters for digital signal processing. Such devices or circuit arrangements for digital-to-analog conversion (called D/A conversion in the following) are used for digital signal processing in, for example, television, radio broadcasting or radio receiving technology, as D/A changers, D/A converters or D/A transformers for image signals and sound signals. In that case digital signals are, for processing, converted into analog signals.

The performance capability of digital signal processing has expanded through constantly increasing capacity of memory chips as well as increasing performance of processors at great speed. The performance capability of D/A converters with respect to resolution and bandwidth has increased substantially more slowly by comparison with components of that kind in digital signal processing. In particular, fast D/A converters are needed for direct digital frequency synthesis (abbreviated to DDS), since the performance of the fastest DDS modules currently available is limited by the D/A converter.

SUMMARY OF THE INVENTION

The invention therefore has the object of providing a method and a device for digital-to-analog conversion of a digital signal in which an improved performance capability may be possible with respect to bandwidth and resolution capability.

According to a first aspect of the invention there is provided a method of digital-to-analog conversion of a band-limited digital signal, in which the signal is transformed on the basis of orthogonal functions, wherein coefficients associated with the orthogonal functions and the signal are determined and these are subjected to digital-to-analog conversion and wherein the signal is transformed back in the analog region on the basis of the analog coefficients, which result therefrom, by means of orthogonal functions.

Such a method proceeds from the consideration that, instead of sequential digital-to-analog conversion of individual scanning values of a conventional D/A converter, a whole interval of the time function of the signal is processed. For that purpose, the signal time-limited to the interval is preferably described on the basis of orthogonal functions. The signal is preferably broken down into several intervals. Through limitation of the time function of the signal to the interval with subsequent transformation by means of orthogonal functions, the signal is fully determined in the digital region on the basis of digital coefficients of the orthogonal functions in equidistant or non-equidistant spacing and can be reconstructed from these coefficients. In other words, the digital signal is processed on the basis of orthogonal functions into an equation for its transform, which is then converted from digital to analog and transformed back in the original region, whereby the original function of the signal is determined in the analog region.

Expediently, the signal is limited in the time region to the interval and is represented within the interval by a sum of orthogonal functions with a presettable number of summands, wherein the coefficients, which are associated with the orthogonal functions, for the interval are determined and subjected to digital-to-analog conversion and wherein the signal is represented in the analog region by multiplication of the analog coefficients, which result therefrom, by orthogonal functions. The signal is preferably resolved into several intervals so that the signal can be represented over a large time range. In the case of band limitation of the signal, the scanning theorems are preferably followed. According to the scanning theorems, discrete values of the frequency function or time function suffice for complete description of the signal in the case of limitation of the time function or frequency function. The time function of the signal is preferably represented by development according to a complete system of orthogonal functions. The band-limited signal is fully described by a finite summation.

The achievable quality of the approximation results from the number of summands, which is discontinued in a real system after a finite number. In that case, the minimum value for the number N of the summands (also termed support points) results from the scanning theorems in the time region and frequency region for time-limited and band-limited signals. The number of summands N is preferably determined by the equation:

$$N = \frac{T}{\tau} \quad (1)$$

wherein T=length of the interval in the time region and τ=segment in the time region,
wherein $$\tau = \frac{1}{2B} \text{ (Nyquist criterion)} \quad (2)$$

wherein B=bandwidth.

The number of summands is in that case preferably selected so that a sufficient resolution is ensured. The systems of orthogonal functions in the digital region (transformation) and in the analog region (inverse transformation) are preferably selected to be the same. Alternatively, the systems of orthogonal functions (also termed basic functions) can also be different.

Expediently, the digital signals are transformed in such a manner that these are multiplied in the digital region by presettable orthogonal functions and the digital coefficients associated with these functions are ascertained. The digital signal is fully described in the digital region on the basis of this transformation. In the example of Walsh functions, the transformation (=determination of the inner product) is described in accordance with the following equations:

$$x^d(t_i) = \sum_j^N a_j^d \cdot g_j^d(t) = \sum_j^N (x^d(t), g_j^d(t)) \cdot g_j^d(t), \quad (3)$$

$$a_j^d = \Sigma x^d(t_i) \cdot wal(j\Phi) \cdot \tau \quad (4)$$

wherein $$\Theta = \frac{t}{T}$$

and, for example, wherein $g_j^d(t)=wal(j,\theta)$=Walsh functions, wherein $x^d(t)$=time function of the digital signal, $g_j^d(t)=$ orthogonal functions in the digital region, $a_j^d$=coefficients, in the digital region and N=number of summands (=number of parallel channels or branches or D/A converter).

The equation (3) is the definition of the inner product between $x^d(t_i)$ and $g_j^d(t)$. For brevity, the symbolic term $(x(t), g_j(t))$ is used in the following.

In a case where basic functions differ in the digital and the analog, the linking of the coefficients takes place by a linear transformation according to:

$$x(t) = \sum_j^N a_j^d \cdot g_j^d(t) = \sum_j^N b_j \cdot h_j(t), \quad (5)$$

under the precondition that $g_j(t) \approx h_j(t)$, wherein x(t)=time function of the signal, $g_j^d(t)$=orthogonal functions in the digital region, $a_j$, $b_j$=coefficients in the analog region, $h_j(t)$=orthogonal functions in the analog region, $a_j^d$=coefficients in the digital region and N=number of the summands.

For determination of the coefficients $b_j$ in equation (5), the scalar product (inner product) is formed.

$$\sum_j \frac{a_j^d}{(x, g_j)} g_j = \sum_j \frac{b_j}{(x, h_j)} h_j \bigg| h_i \text{ formation of the inner product} \quad (6)$$

$$\sum_j (x, g_j)(g_j, h_i) = (x, h_i) \quad (7)$$

$$\sum_j a_j(g_j, h_i) = b_i \quad (8)$$

In that case, the coefficients in the digital region are preferably ascertained on the basis of a transformation matrix with matrix elements $(g_j, h_i) = m_{j,i}$ according to:

$$\begin{pmatrix} \cdots \\ \cdots \\ b_i \\ \cdots \end{pmatrix} = \begin{pmatrix} \cdots & \cdots & \cdots & \cdots \\ \cdots & \cdots & \cdots & \cdots \\ \cdots & \cdots & \cdots & \cdots \\ \cdots & \cdots & \cdots & (g_j, h_i) \end{pmatrix} \begin{pmatrix} \cdots & \cdots & a_j & \cdots \end{pmatrix} \quad (9)$$

In accordance with the respective prescriptions and criteria for the digital signal processing, trigonometric functions, Walsh functions and/or complex exponential functions are used as orthogonal functions. In the analog region, trigonometric functions, for example sine and or cosine functions, are preferably used. In the digital region, functions such as, for example, Walsh or Haar functions are preferably used, which functions can assume only the value +1 or −1.

Preferably, the analog coefficients are transformed back in such a manner that the signal is described in the analog region by multiplication of the analog coefficients by orthogonal functions and subsequent summation. For example, the signal is represented in the analog region on the basis of the generalised Fourier analysis:

$$x(t) = \sum_j^N a_j \cdot g_j(t) = \sum_j^N (x(t), g_j(t)) \cdot g_j(t), \quad (10)$$

wherein x(t)=time function of the signal, $g_j(t)$=orthogonal functions, $a_j$=coefficients, N=number of the summands= number of the orthogonal functions=number of the support points in the transformed region (frequency region for the special case of the Fourier transformation)=number of the parallel channels and T=length of the interval in the time region.

In an orthonomised system there applies for the inner product of orthogonal functions:

$$(g_j, g_i) = \begin{cases} 0, & \text{when } j \neq i \\ 1, & \text{when } j = i \end{cases} \quad (h_j, h_i) = \begin{cases} 0, & \text{when } j \neq i \\ 1, & \text{when } j = i \end{cases}$$

According to a second aspect of the invention there is provided a device for digital-to-analog conversion of a band-limited digital signal with an input module for transformation of the signal in the digital region by means of orthogonal functions, a module for digital-to-analog conversion of digital coefficients of the transformation function and an output module for transformation back of the signal in the analog region.

Advantageously, the input module serves for representation of the signal within the interval by a sum of orthogonal functions with a presettable number of summands. For preference, the entire signal is broken down into several intervals. Preferably, the determination of the coefficients for the interval takes place by means of the input module.

The digital signal is described within the interval by means of the input module on the basis of the orthogonal functions. Subsequently, the digital coefficients associated with the functions are determined, wherein the digital-to-analog conversion of the N coefficients takes place in N modules, for example in N conventional D/A converters. The signal can be fully represented in the analog region through multiplication of the analog coefficients, which are thus ascertained, by the orthogonal functions in the analog region by means of the output module and subsequent summation.

In an advantageous embodiment the input module comprises a number, which corresponds with the number of summands, of cells of a shift register and a corresponding number of N multiplicators and summation elements. The shift register and the multiplicators serve for the transformation of the digital signal on the basis of presettable orthogonal functions. The digital coefficients associated with the functions are ascertainable by means of the summation elements. A particularly simple construction of the device, in terms of circuitry, for transformation of the digital signal thereby results.

After the transformation of the digital signal and consequently the determination of the coefficients of the orthogonal functions in the digital region, the digital-to-analog conversion of the coefficients can be carried out by means of the conventional D/A converters. In the analog region the output module advantageously comprises a number, which corresponds with the number of summands, of multipliers and a summation element. The multiplier serves for multiplication of the respective analog coefficients by the orthogonal functions in the analog region. Through subsequent summation of all parallel branches, the signal can be fully represented in the analog region. The number of branches or channels in that case corresponds with the number of summands. The device can comprise N branches with N cells of the shift register, N times the number of multiplicators, N summation elements, N D/A converters and, for the transformation back at the output side, N multipliers and the summation element. A device, which has this construction in terms of circuitry, for digital-to-analog conversion of the signal is also termed a correlation digital-to-analog converter.

In addition, an integrator, for example a low-pass filter, can be provided. The low-pass filter is preferably connected downstream of the summation element for smoothing the functions in the analog region.

Advantageously, the above-described device for digital-to-analog conversion of a signal comprises a direct digital frequency synthesis module (DDS module). The performance of the DDS module is substantially improved relative to conventional DDS modules in the respect of a particularly high scanning rate.

The advantages achieved by a method exemplifying and a device embodying the invention are that by comparison With a single conventional D/A converter with a high scanning rate, the scanning rate of the individual D/A converter of the device can, through the plurality of parallelly connected D/A converters (number of parallel branches equal to number of presettable summands), be selected to be smaller by the factor of the number of summands.

BRIEF DESCRIPTION OF THE DRAWINGS

Examples of the method and embodiments of the device of the present invention will now be more particularly described with reference to the accompanying drawings, in which.

DETAILED DESCRIPTION

Figure 1:
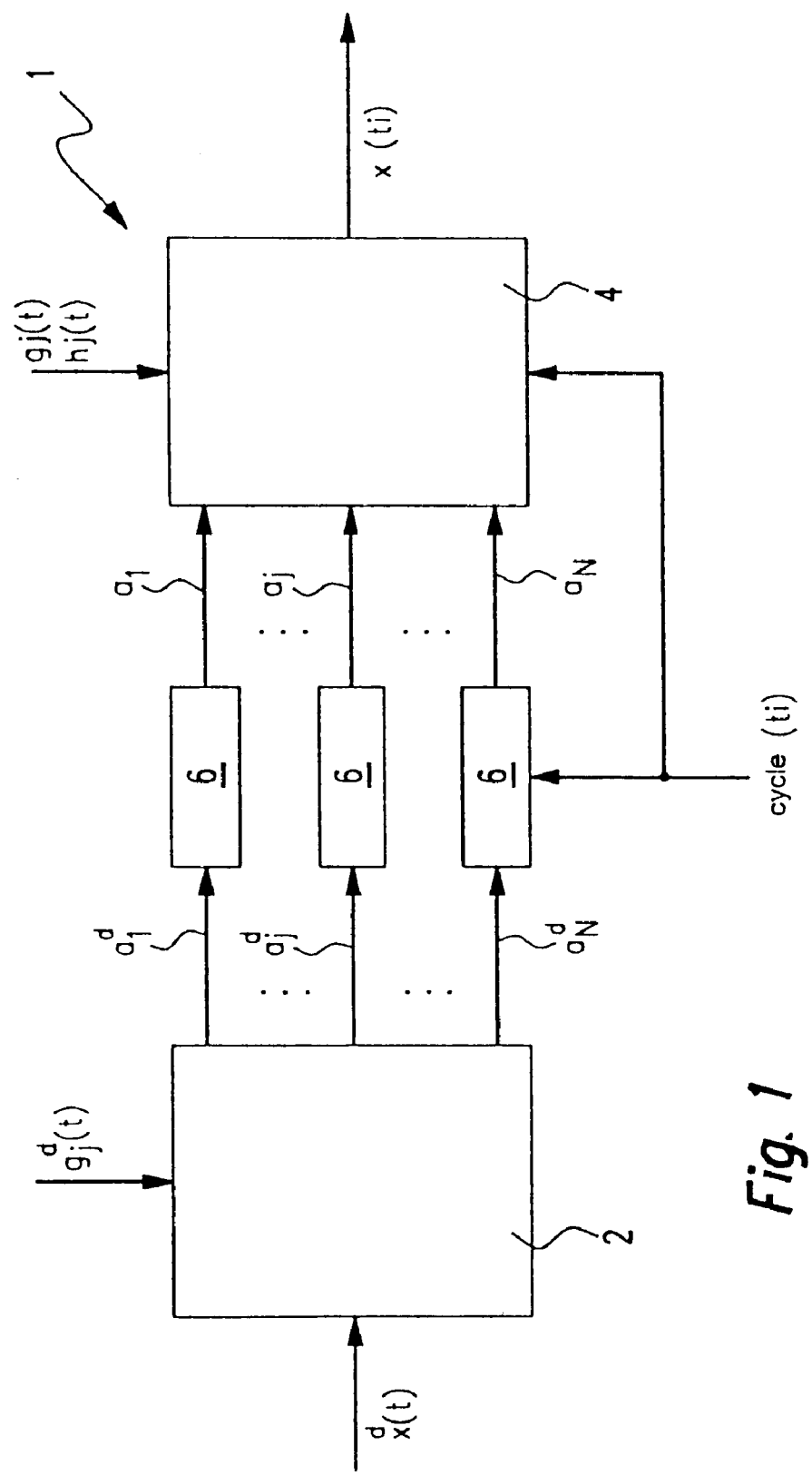
FIG. 1 is a schematic diagram of a device embodying the invention for digital-to-analog conversion of a signal, comprising an input module, a module for digital-to-analog conversion and an output module.

Referring now to the drawings, in which equivalent parts are provided with the same reference numerals, FIG. 1 schematically depicts a device 1 for digital-to-analog conversion of a digital signal $x^d(t)$, comprising an input module 2 for transformation of the signal $x^d(t)$ and an output module 4 for transformation back of the signal $x(t)$ in the analog region. A number of modules 6 for digital-to-analog conversion of the associated digital coefficients $a_j^d$ of the transformation is provided between the input module 2 and the output module 4.

In operation of the device 1, the signal $x^d(t)$ fed to the input module 2 is resolved into several intervals of the duration T. The digital signal $x^d(t)$ is fully described within a single interval T by a finite summation of orthogonal functions $g_j^d(t)$ The number N of the summands is, in that case, presettable. The number of summands, or support points, corresponds with the number of time segments into which the time interval T is resolved. In that case, the minimum value for the number N of summands results from the scanning theorems in the time region and frequency region according to equations (1) and (2).

Orthogonal functions $g_j^d(t)$ (wherein $1 \leq j \leq N$) are fed to the input module 2 in dependence on the number N of summands. The digital signal $x^d(t)$ is transformed on the basis of the orthogonal functions $g_j^d(t)$ By means of the input module 2 the coefficients $a_j^d$, which are associated with the orthogonal functions $g_j^d(t)$, of the respective summands j are determined in accordance with equation (4).

number, which corresponds with the number N of summands j, of modules 6, which are connected in parallel to one another, is provided for digital-to-analog conversion of the values of the coefficients $a_j^d$. On the basis of the analog values of the coefficients a the signal $x^d(t_i)$ is represented in the analog region by means of the inverse transformation on the basis of orthogonal functions $h_j(t)$ or $g_j(t)$. The result of the inverse transformation is the analog signal $x(t)$. For example, the signal $x(t)$ is, represented in the analog region on the basis of the generalised Fourier analysis according to equation (10).

Figure 2:
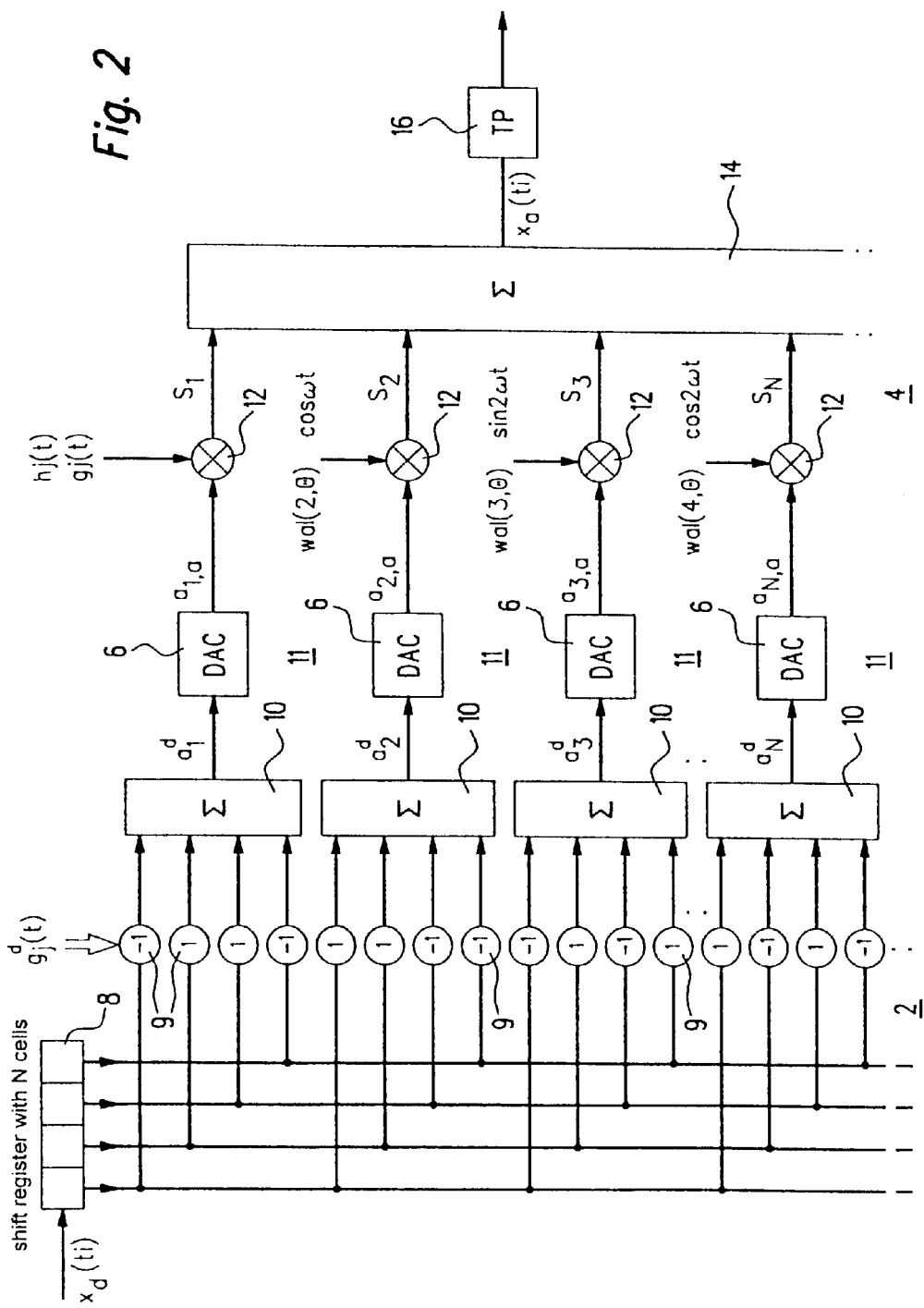
FIG. 2 is a schematic diagram showing the device of FIG. 1 with one form of input module and output module.

An embodiment, in terms of circuitry, of the input module 2 by means of a shift register 8 comprising N cells is illustrated in FIG. 2. The digital signal $x^d(t_i)$ is read in blocks of N function values into the shift register 8. The output values of the N cells of the shift register 8 are multiplied by orthogonal functions $g_j^d(t)$, for example $wal(j,\Phi)$, by means of N multiplicators 9 and combined in accordance with equation (10) into the coefficients $a_1^d$ to $a_N^d$ by means of summating elements 10. The coefficients (+/−1) in FIG. 2 relate to, by way of example, Walsh functions (see FIG. 3b). A multiplication by +1 is realised, in terms of circuitry, by a continuous conduction. The device 1 comprises N branches 11 for digital-to-analog conversion of the signal $x^d(t_i)$. Each of the N branches 11 in that case comprises a summation element 10 for determination of the digital coefficients $a_1^d$ to $a_N^d$, a D/A converter 6 and a multiplier 12 for multiplication of the analog coefficients $a_1$ to $a_N$ by orthogonal functions.

The ascertained coefficients $a_1^d$ to $a_N^d$ are converted by N parallel digital-to-analog coefficients $a_{1,a}$ to $a_{N,a}$. These analog coefficients $a_{1,a}$ to $a_{N,a}$ modulate the orthogonal functions $h_j(t)$ or $g_j(t)$ in the analog region for representation of the signal $x_a(t)$ according to equation (10).

The modules 6 are, for example, conventional D/A converters. The output module 4 comprises, for representation of the signal $x^d(t_i)$ in the analog region, in each branch 11 a multiplier 12 for the inverse transformation of the analog coefficients $a_1^d$ to $a_N^d$ on the basis of orthogonal functions $g_j$ (for like systems of orthogonal functions in the analog and digital region) or $h_j$ (for different systems of orthogonal functions in the digital and analog region). The results—the summands $s_1$ to $s_N$ in the analog region—are subsequently applied to a summating element 14 of the output module 4. The signal $x_a(t)$ can be fully represented in the analog region by summation of the results of all parallel branches 11. The number of branches 11 in that case corresponds with the number N of summands.

Walsh functions or, in the analog region, preferably trigonometric functions, such as, for example, sine functions, cosine functions and/or complex exponential functions, are used as orthogonal functions $g_j(t)$, $h_j(t)$. If different functions are used in the digital region and analog region, the considerations described by the equations (6) to (10) apply.

If analog Walsh functions are used as orthogonal functions $g_j(t)$, a low-pass filter (TP) 16 is provided for smoothing. The low-pass filter 16 is connected downstream of the summation element 14.

Each branch 11 thus comprises the shift register 8 with N cells and the multiplicators 9 at the input side for the transformation, the module 6 (also called D/A converter or DAC) for the digital-to-analog conversion and the multipliers 12 at the output side for the transformation back. All branches 11 are subsequently applied to the summating element 14. A device 1, which has this construction in terms of circuitry, for digital-to-analog conversion of the signal $x^d(t_i)$ is preferably termed a correlation digital-to-analog converter. As a result of the resolution of the time interval T into N segments of the duration τ, the Nth time for the conversion is available at each of the N D/A converters by comparison with a single D/A converter. This means a substantial reduction in the demands on the individual D/A converter.

Figure 3A:
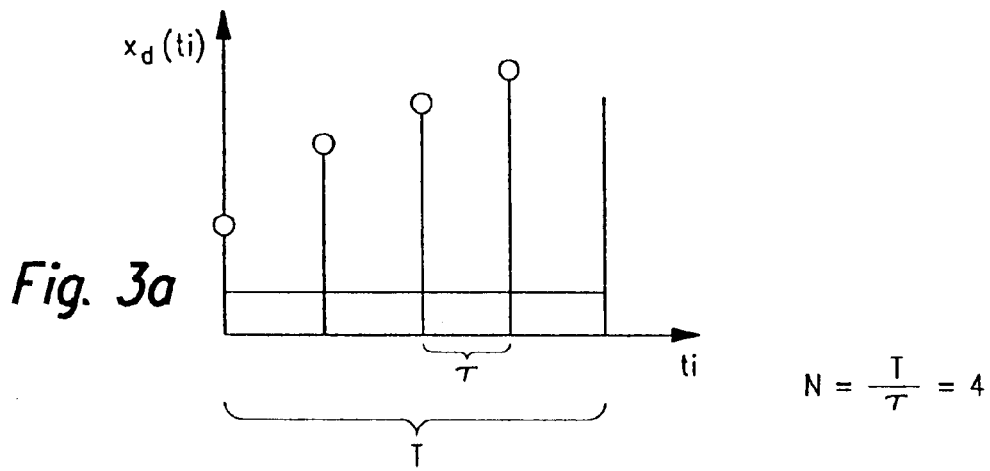
FIGS. 3a and 3b are diagrams showing an input signal and different Walsh functions usable in a method exemplifying the invention.
Figure 3B:
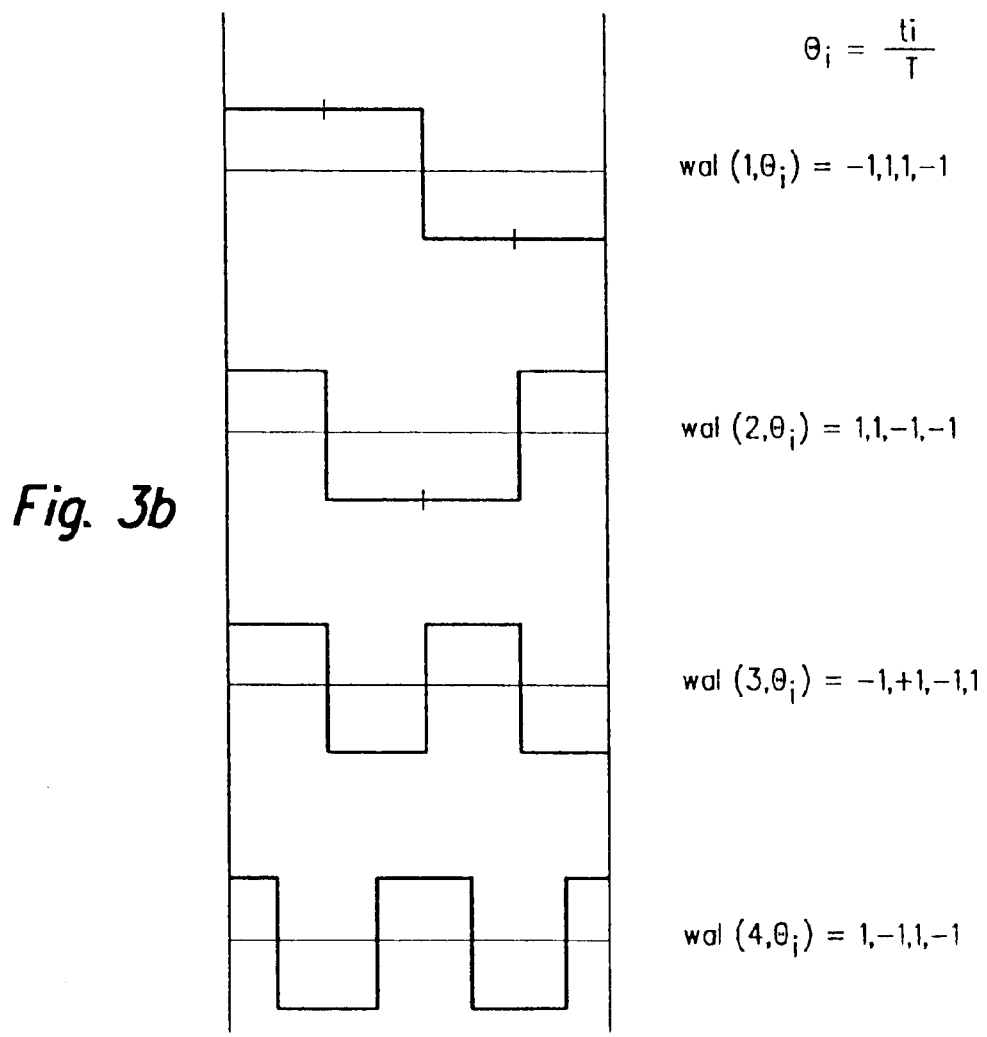

The digital input signal $x^d(t_i)$ with the interval T and N segments of the duration τ, wherein N=4, illustrated in FIG. 3a by way of example. In this instance T=Nτ. For a signal limited to the bandwidth B. the scanning theorem delivers the maximum length of the segment: τ=1/2 B. In FIG. 3b there are illustrated, corresponding with N=4, the first four Walsh functions wal(j,Φ) with which the digital signal $x^d(t_i)$ for transformation is correlated. The count sequences +1;−1 represent the Walsh function values at the cycle points $t_i$ (in the case of approximation from the left). The zero Walsh function (=constant, direct voltage component) is usually of no significance for signal transmission and therefore has not been taken into consideration.

Figure 4:
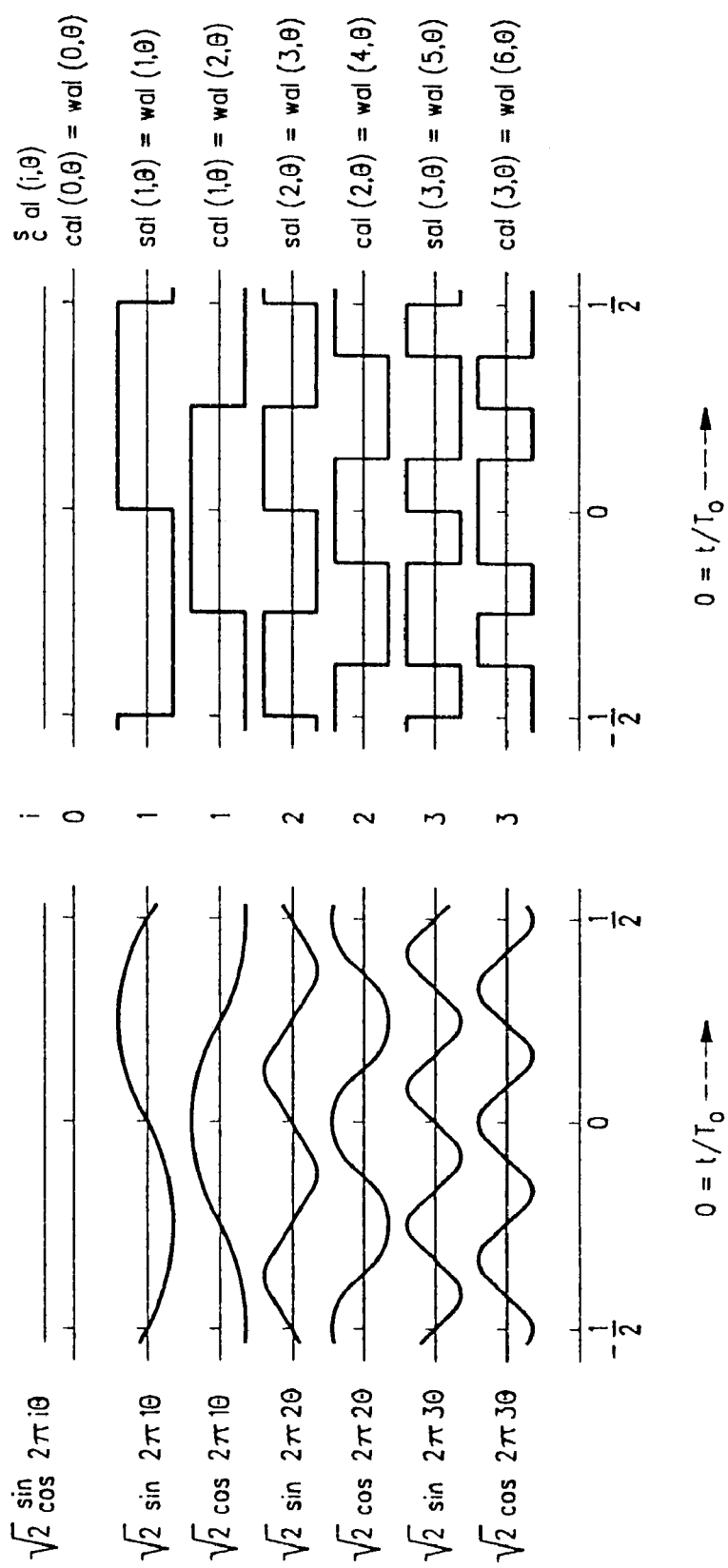
FIG. 4 is a diagram showing the Walsh functions and the corresponding trigonometric functions.

The first six Walsh functions and the corresponding trigonometric functions are illustrated in FIG. 4. The systems of orthogonal functions in the analog region and the systems of orthogonal functions in the digital region can be different. In that case, trigonometric functions are preferably used in the analog region as orthogonal functions $g_j(t)$. Walsh or Haar functions are preferred for use in the digital region. The linking of the associated coefficients $a_j$ and $b_j$ is carried out by, for example, linear transformation according to the equations (5) to (9).

The embodiment of the above-described device 1 varies in dependence on the presetting of the bit rate as well as on the form of predetermined orthogonal functions for transformation and transformation back. According to the respective form, the device is particularly suitable for use in a direct digital frequency synthesis module. In addition, further applications in the field of digital signal processing are possible, for example in radar technology or radio broadcasting technology.

What is claimed is:

1. A method of digital-to-analog conversion of a band-limited signal ($x^d(t)$), comprising the steps of:
    transforming the signal ($x^d(t)$) on the basis of orthogonal functions ($g_j(t)$), determining coefficients ($a_j^d$) associated with the orthogonal functions ($g_j^d(t)$) and the signal $x_d(t)$),
    subjecting the coefficients ($a_j^d$) to digital-to-analog conversion so as to define analog coefficients ($a_j$), and
    transforming a signal ($x_a(t)$) back in the analog region on the basis of the analog coefficients ($a_j$) using orthogonal functions ($h_j(t)$ or $g_j(t)$).

2. The method according to claim 1, wherein the signal ($x^d(t)$) is resolved in a time region into intervals (T) of the duration T and is represented within an interval (T) by a sum of the orthogonal functions ($g_j^d(t)$) with a presettable number (N) of summands, wherein the coefficients ($a_j^d$) associated with the orthogonal functions ($g_j^d(t)$) are determined for the interval (T) and subjected to digital-to-analog conversion and wherein the transformation back takes place, and the signal ($x_a(t)$) is represented in the analog region by the analog coefficients ($a_j$) and the orthogonal functions ($h_j(t)$ or $g_j(t)$).

3. The method according to claim 1, wherein a number (N) of the orthogonal functions ($g_j^d(t)$) is determined by a scanning theorem N=T/τ, wherein T=length of an interval in a time region and τ=segment in the time region, wherein T=1/2 B and B=bandwidth.

4. The method according to claim 1, wherein the analog coefficients ($a_j$) are transformed back in such a manner that the signal ($x(t)$) is described in the analog region by multiplication of the analog coefficients ($a_j$) by orthogonal functions ($h_j(t)$ or $g_j(t)$) and subsequent summation.

5. The method according claim 1, wherein the orthogonal functions ($g_j^d(t)$ or $g_j(t)$ or $h_j(t)$) are at least one of trigonometric functions, Haar functions, Walsh functions and complex exponential functions.

6. The method according to claim 1 wherein the discrete values of the respective coefficients ($a_j^d$ or $a_j$) are, in the case of different orthogonal functions ($g_j^d(t)$ or $g_j(t)$ or $h_j(t)$) in a digital region and the analog region, adapted to the presettable orthogonal functions ($g_j^d(t)$ or $g_j(t)$ or $h_j(t)$).

7. A device for digital-to-analog conversion of a band-limited signal ($x^d(t)$), comprising:
    an input module for transformation of the signal ($x^d(t)$) in the digital region on the basis of orthogonal functions so as to determine coefficients ($a_j^d$) associated with the orthogonal functions and the signal $x^d(t)$),
    a module for digital-to-analog conversion of the coefficients ($a_j^d$) of the transformation, and
    an output module for transformation back of the signal ($x_a(t)$) in the analog region.

8. The device according to claim 7, wherein the input module is operable to represent the signal ($x^d(t)$) within an interval (T) in the time region by a sum of orthogonal functions ($g_j^d(t)$ or $h_j(t)$) with a presettable number (N) of summands () and to determine the coefficients ($a_j^d$), which are associated with the orthogonal functions ($g_j^d(t)$), for the interval (T), and the output module is operable to represent the signal ($x_a(t)$) in the analog region through multiplication of the analog coefficients ($a_j$) by the orthogonal functions ($h_j(t)$) and subsequent summation.

9. The device according to claim 7, wherein the input module comprises a shift register with a plurality of cells corresponding in number with the number (N) and a corresponding number of multiplicators and summation elements.

10. The device according to claim 7, wherein the output module comprises a plurality of multipliers corresponding in number with the number (N), and a summation element.

11. The device according to claim 7 further comprising a low-pass filter for filtering an output signal of the device.

* * * * *